United States Patent
Kim et al.

(10) Patent No.: US 11,843,065 B2
(45) Date of Patent: Dec. 12, 2023

(54) SOLAR CELL MODULE HAVING PARALLEL AND SERIES CONNECTION STRUCTURE

(71) Applicant: KOREA UNIVERSITY RESEARCH AND BUSINESS FOUNDATION, Seoul (KR)

(72) Inventors: Donghwan Kim, Yangpyeong-gun (KR); Yoonmook Kang, Seoul (KR); Yongseok Jun, Seoul (KR); Hae-Seok Lee, Seoul (KR); Yujin Jung, Seoul (KR); Jongwon Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/901,432

(22) Filed: Sep. 1, 2022

(65) Prior Publication Data

US 2023/0006080 A1    Jan. 5, 2023

Related U.S. Application Data

(63) Continuation of application No. PCT/KR2020/009416, filed on Jul. 17, 2020.

(30) Foreign Application Priority Data

Mar. 5, 2020    (KR) .................. 10-2020-0027510

(51) Int. Cl.
*H01L 31/0475*    (2014.01)
*H01L 31/0232*    (2014.01)

(52) U.S. Cl.
CPC .... *H01L 31/0475* (2014.12); *H01L 31/02325* (2013.01)

(58) Field of Classification Search
None
See application file for complete search history.

(56) References Cited

U.S. PATENT DOCUMENTS

| 2012/0273030 A1* | 11/2012 | Jee | H01L 31/0504 |
| | | | 136/251 |
| 2014/0246089 A1* | 9/2014 | Lee | H01L 31/046 |
| | | | 438/69 |
| 2015/0194555 A1 | 7/2015 | Zhang et al. | |

FOREIGN PATENT DOCUMENTS

| JP | 2008-251799 A | 10/2008 |
| JP | 2009-277817 A | 11/2009 |

(Continued)

OTHER PUBLICATIONS

International Search Report dated Dec. 1, 2020, in counterpart of PCT/KR2020/009416 (3 pages in Korean, 2 pages in English).

*Primary Examiner* — Daniel P Malley, Jr.
(74) *Attorney, Agent, or Firm* — NSIP Law

(57) ABSTRACT

Disclosed is a solar cell module including a first solar cell unit including a plurality of solar cells and a plurality of condensing layers, which are arranged alternately, a second solar cell unit including a plurality of solar cells and a plurality of condensing layers, which are arranged alternately, and each of the plurality of solar cells of the first solar cell unit and the second solar cell unit includes a first electrode disposed on one side thereof and a second electrode disposed on an opposite side thereof, whereby a visibility, by which the light passes through the solar cell module, is increased by including the plurality of solar cells and the plurality of condensing layers, through which a visual ray may pass.

16 Claims, 11 Drawing Sheets

(56) References Cited

FOREIGN PATENT DOCUMENTS

| | | |
|---|---|---|
| JP | 2013-516065 A | 5/2013 |
| JP | 2014-41944 A | 3/2014 |
| JP | 2015-26850 A | 2/2015 |
| KR | 10-0765965 B1 | 10/2007 |
| KR | 10-2010-0084887 A | 7/2010 |
| KR | 10-2010-0107600 A | 10/2010 |
| KR | 10-2012-0117085 A | 10/2012 |
| KR | 10-2013-0059170 A | 6/2013 |
| KR | 10-2015-0141822 A | 12/2015 |
| KR | 10-2017-0070882 A | 6/2017 |
| KR | 10-1948993 B1 | 2/2019 |
| KR | 10-2019-0089404 A | 7/2019 |

\* cited by examiner

40: 41, 42, 43, 44, 45

FIG. 6A
FIG. 6B
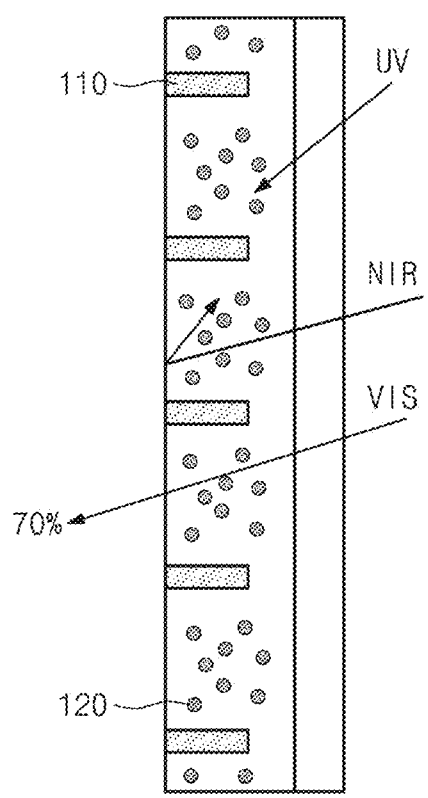
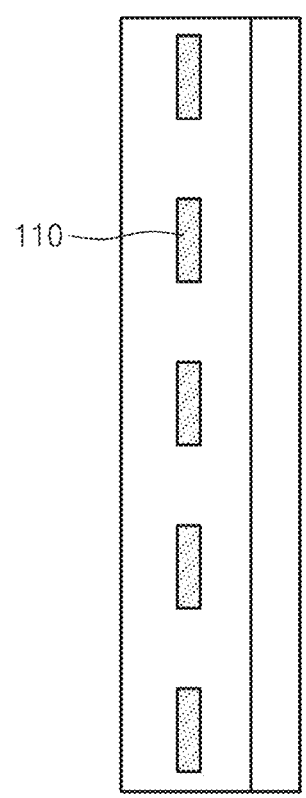

SOLAR CELL MODULE HAVING PARALLEL AND SERIES CONNECTION STRUCTURE

CROSS-REFERENCE TO RELATED APPLICATIONS

Pursuant to 35 USC 120 and 365(c), this application is a continuation of International Application No. PCT/KR2020/009416 filed on Jul. 17, 2020, and claims the benefit under 35 USC 119(a) of Korean Application No. 10-2020-0027510 filed on Mar. 5, 2020, in the Korean Intellectual Property Office, the entire disclosures of which are incorporated herein by reference for all purposes.

STATEMENT REGARDING GOVERNMENT SPONSORED RESEARCH OR DEVELOPMENT

The concept of the present invention is derived from research conducted as part of 'Renewable Energy Core Technology Development (R&D)' of MTI (Ministry of Trade, Industry and Energy). (Project number: 1415165293, Research management institution: Korea Institute of Energy Technology Evaluation and Planning, Research project name: Development of an easily scalable transparent solar cell platform, Host institution: Korea University Industry-University Cooperation Foundation, Research period: 2019.09.01~2020.05.31, Contribution rate: 1/2).

The concept of the present invention is derived from research conducted as part of 'Renewable Energy Core Technology Development (R&D)' of MTI (Ministry of Trade, Industry and Energy). (Project number: 1415165308, Research management institution: Korea Institute of Energy Technology Evaluation and Planning, Research project name: 30 cm×30 cm class ultra-high-efficiency, flexible, and high-stability perovskite solar cell module development, organized by: Korea University Industry-University Cooperation Foundation, research period: 2022.01. 01 to 2023.03.31, contribution rate: 1/2).

There is no property interest of the Korean government in any aspect of this invention.

TECHNICAL FIELD

Embodiments of the present disclosure described herein relate to a solar cell module having a parallel/series connection structure.

BACKGROUND ART

In general, a solar system is a system that converts light energy into electric energy by using solar cells, and is used as an independent power source for general homes or the industries or is used as an auxiliary power source in association with systems of normal AC power sources.

The solar cells are manufactured through p-n junctions of semiconductor materials by using diffusion, and uses a photovoltaic effect, in which a small amount of currents flow under light, and most of general solar cells include p-n junction diodes of large areas, and are applied as unit solar cells or cells when electromotive forces generated at opposite ends of the p-n junction diodes are connected to an external circuit. Because the electromotive forces of the solar cells are low, a plurality of solar cells are connected to each other to constitute a solar cell module (a photovoltaic module) having an appropriate electromotive force. A grid-connected solar system used for a generally used building mounted type includes a plurality of solar cell arrays that convert solar energy into electric energy, and an inverter that converts DC power corresponding to electric energy obtained through conversion in the solar cell arrays to AC power and supplies the AC power to a used place.

In the solar system, installation of the solar cell arrays installed to obtain energy of the sunlight is the most important element in a configuration of the system, and the solar cell arrays are installed at a separately secured place or are installed on the roof of a building.

Accordingly, a separate space has to be secured to install the solar system in a building, but a cooling tower that constitutes a cooling device is generally installed on the roof of the building, and thus a place for installing the solar cell arrays is narrow and limited whereby the installation of the solar cell arrays is restricted and the installation operation is difficult.

There is a case, in which a solar system is applied to a window system installed for lighting and ventilation of a building to supplement the disadvantage.

That is, Korean Patent No. 10-0765965 discloses a window using solar cells.

A conventional window using solar cells will be described with reference to FIG. 1.

FIG. 1 is a perspective view of a conventional window.

Referring to FIG. 1, a conventional window 10 includes a solar cell array 11 that converts solar energy into electric energy, and a frame 11a coupled to a periphery of the solar cell array 11 and mounted in an opening 13 of a wall body 12 of the building.

That is, the conventional window 10 has a structure, in which the solar cell array 11 is fixed to an inner central portion of the frame 11a having a rectangular shape, and an outer glass window located on an outer side of the wall body 12 of the building and an inner glass window located on an inner side thereof are disposed on a front side and a rear side of the solar cell array 11 to be spaced apart from the solar cell array 11 by a specific distance and are fixed.

Meanwhile, a device such as a blind or a vertical may be separately installed for privacy when most of the windows are installed, and costs therefor are not low.

In this way, conventionally, the windows and the blinds are separately provided and thus costs or spaces are not efficient.

In recent years, methods for directly installing the blinds to the glass of the building for installation have been suggested.

That is, as illustrated in FIG. 2, it is manufactured by disposing a plurality of solar cells 21 implemented of crystalline or multi-crystalline between reinforced glass boards 22a and 22b, and attaching them by using EVS films 23.

Generally, a front surface of the conventional solar cell module 20 manufactured in this way has a blue color or a black color as illustrated in FIG. 3A, and a rear surface thereof mostly has a gray color as illustrated in FIG. 3B.

In the conventional solar cell module 20, two electrode lines of a width of 3 mm to 5 mm are formed of silver paste Ag through screen printing to form the electrode line 23b on a rear surface of the solar cell 21 and are dried in a roll conveyor employing an infrared (IR) lamp. The color of the electrode line 23b dried in this way is close to a bright gray color.

The solar cells 21 are manufactured by joining a N-type material to a P-type wafer or a P-type material to an N-type wafer. When a P-type is used, rear surfaces of the solar cells 21 have a plus (+) polarity and front surfaces thereof have a minus (−) polarity.

When the solar cell module 20 is manufactured by using the solar cells 21, the solar cells 21 are connected to each other in series or in parallel.

Then, a interconnector ribbon 24 is used to connect the solar cells 21, a material of the connection ribbon 24 generally includes Sn+Pb+Ag, Sn+Ag, and Sn+Ag+Cu, and in the case of series connections, a silver paste electrode line 23a of a minus (−) polarity (an negative electrode in the case of the P-type and a positive electrode in the case of the N-type) of a width of 3 mm to 5 mm, which is formed on the front surface of the solar cell 21, is connected to a silver paste electrode line 23b of a plus (+) polarity (a positive electrode in the case of a p-type and a negative electrode in the case of an n-type) of a width of 3 mm to 5 mm, which is formed on the rear surface of another solar cell through the interconnector ribbon 24.

In this way, the interconnector ribbons 24 that connect the solar cells 21 has a width of 1.5 mm to 3 mm and a thickness of 0.01 to 0.2 mm.

The connection methods include an indirect connection method by an IR lamp, a halogen lamp, and hot air and a direct connection method by an iron.

Meanwhile, the EVA film 23 located between the glass boards 22a and 22b of the solar cell module 20 starts to be melted at a temperature of 80° C. and becomes clear and transparent at a temperature of about 150° C., joins the solar cells 21 and the glass boards, and prevents corrosion or a short-circuit of the silver electrodes 23a and 23b and the ribbons 24 of the solar cells by preventing external moisture and air that face the solar cells 21 from penetrating.

The EVA film 23 is melt between the dually jointed glass boards 22a and 22b of the solar cell module 20 to be viewed clearly and transparently when being laminated by a laminator (not illustrated), and then, the remaining portions, except for the solar cells 21 and the interconnector ribbons 24, are viewed clearly.

The conventional solar cell module 20 for BIPV is manufactured by using crystalline or multi-crystalline solar cells 21, and is disposed between the dual glass boards 22a and 22b of the building to be viewed from an inside and an outside of the building as it is.

Double-side light-reception type or single surface light-reception type solar cells 21 are used for the solar cells 21 of the solar cell module 20 mounted on the building in this way. A color of the light receiving surfaces of the solar cells 21 have a color in a process of depositing a reflection preventing film due to a PECVD and APCVD (not illustrated) that is a vacuuming facility. Generally, the surface has a blue color or a black color, but the rear surfaces of the single surface light-reception type cells have a gray color because it is formed of aluminum (Al) through a vacuuming facility (not illustrated) or screen printing to form an electrode.

Furthermore, in the conventional solar cell module 20, several or several tens of solar cells 21 are connected by the interconnector ribbons 24 in the interiors of the glass boards 22a and 22b, and the interconnector ribbons 24 are not maintained straight constantly and are deflected and curved.

In this state, when the solar cell module 20 is finished through lamination, the shapes of the interconnector ribbons 24 that connect the solar cells 21 in the glass boards 22a and 22b are deflected and uneven as a whole.

Furthermore, the color of the interconnector ribbons 24 of the conventional solar cell module 20 is silver, and when the solar cell module 20 for BIPV is manufactured, the interconnector ribbons 24 have the original color and the front and rear surfaces thereof are exposed in silver.

Accordingly, in the conventional solar cell module 20, the rear surface (non-light receiving surface) thereof and the interconnector ribbons 24 have a gray color and a silver color, and because the silver color of the interconnector ribbons 24 is exposed to an outside through the front glass boards 22a and 22b on a front surface (the light receiving surface) of the solar cell module 20, the gray and silver colors of the rear surface (the non-light receiving surface) is viewed as it is, and the lines of the interconnector ribbons 24 are deflected and curved when the dually joined solar cell module 20 is manufactured, an aesthetic aspect thereof is not good when the solar cell module 20 is attached instead of glass of city buildings.

PRIOR TECHNICAL DOCUMENTS

Patent Documents

[Patent document 001] Korean Patent Application Publication No. 2012-0117085 (Oct. 24, 2012)
[Patent document 002] Korean Patent Application Publication No. 2013-0059170 (Jun. 5, 2013)

DETAILED DESCRIPTION OF THE INVENTION

Technical Problem

An aspect of the present disclosure provides a solar cell module having a parallel/series connection structure that may be installed at any place because the sight is not hindered by manufacturing solar cells of a high efficiency, a safety of which is secured, in various shapes of micrometer sizes for modulation and increasing transmittance, and may enhance an amount of electric power by increasing an incident angle of the sunlight.

An aspect of the present disclosure also provides a solar cell module that provides a parallel and series connection structure, in which a thin film solar cell is manufactured to have a size of micrometers, a space, through which light may pass, is provided between the solar cells, and the unit cells may be connected to each other in series and in parallel in a manufacturing process.

The technical problems that are to be solved by the present disclosure are not limited to the above-mentioned ones, and the other technical problems that have not been mentioned will be clearly understood from the following description by an ordinary person in the art, to which the present disclosure pertains.

Technical Solution

According to an aspect of the present disclosure, a solar cell module includes a first solar cell unit including a plurality of solar cells and a plurality of condensing layers, which are arranged alternately, a second solar cell unit including a plurality of solar cells and a plurality of condensing layers, which are arranged alternately, a first electrode layer electrically connecting a first terminal and one surface of the first solar cell unit, a second electrode layer electrically connected to an opposite surface of the first solar cell unit, a third electrode layer electrically connecting the second electrode layer and one surface of the second solar cell unit, a fourth electrode layer electrically connected to an opposite surface of the second solar cell unit, and a fifth electrode layer electrically connecting the fourth electrode layer and a second terminal, and each of the plurality of solar cells of the first solar cell unit and the second solar cell unit includes a first electrode disposed on one side thereof and a second electrode disposed on an opposite side thereof.

Furthermore, the first electrode layer, the third electrode layer, and the fourth electrode layer may be disposed on the same plane.

Furthermore, the first electrode layer, the third electrode layer, and the fourth electrode layer may be spaced apart from each other, on the same plane, at least one of the condensing layers of the first solar cell unit may be disposed in a spacing space between the first electrode layer and the third electrode layer, and at least one of the condensing layers of the second solar cell unit may be disposed in a spacing space between the third electrode layer and the fifth electrode layer.

Furthermore, the second electrode layer may include a (2-1)-th electrode layer electrically connected to the opposite surface of the first solar cell unit, and a (2-2)-th electrode layer extending from an end of the (2-1)-th electrode layer to one side, and contacting the third electrode layer.

Furthermore, the fourth electrode layer may include a (4-1)-th electrode layer electrically connected to the opposite surface of the second solar cell unit, and a (4-2)-th electrode layer extending from an end of the (4-1)-th electrode layer to one side, and contacting the fifth electrode layer.

Furthermore, at least one of the plurality of solar cells of the first solar cell unit may be a dummy solar cell directly connected to the second electrode layer and the third electrode layer, and at least one of the plurality of solar cells of the second solar cell unit may be a dummy solar cell directly connected to the fourth electrode layer and the fifth electrode layer.

Furthermore, the solar cell module may further include a transparent substrate disposed on side surface of the first electrode layer, the third electrode layer, and the fourth electrode layer.

Furthermore, each of the plurality of solar cells of the first solar cell unit and the plurality of solar cells of the second solar cell unit may be disposed to be perpendicular to a side surface of the transparent substrate.

Furthermore, the condensing layer may include a luminescent solar concentrator (LSC).

Furthermore, the solar cells of the first solar cell unit may be connected in parallel to each other through the first electrode layer and the second electrode layer, the solar cells of the second solar cell unit may be connected in parallel to each other through the third electrode layer and the fourth electrode layer, and the first solar cell unit and the second solar cell unit may be connected in series to each other through the second electrode layer and the third electrode layer.

Advantageous Effects of the Invention

According to an embodiment of the present disclosure, a solar cell module may be installed at any place because the sight is not hindered by manufacturing solar cells of a high efficiency, a safety of which is secured, in various shapes of micrometer sizes for modulation and increasing transmittance, and an amount of electric power may be enhanced by increasing an incident angle of the sunlight.

Furthermore, according to an embodiment of the present disclosure, a thin film solar cell may be manufactured to have a size of micrometers, and the unit cells may be connected to each other in series and in parallel in a manufacturing process The advantageous effects of the present disclosure are not limited to the above-mentioned ones, and the other advantageous effects will be clearly understood by an ordinary person skilled in the art to which the present disclosure pertains.

DESCRIPTION OF THE DRAWINGS

FIG. 6A is a diagram illustrating a horizontal arrangement state of solar cells;

FIG. 6B is a diagram illustrating a vertical arrangement state of solar cells;

BEST MODE

Figure 1:
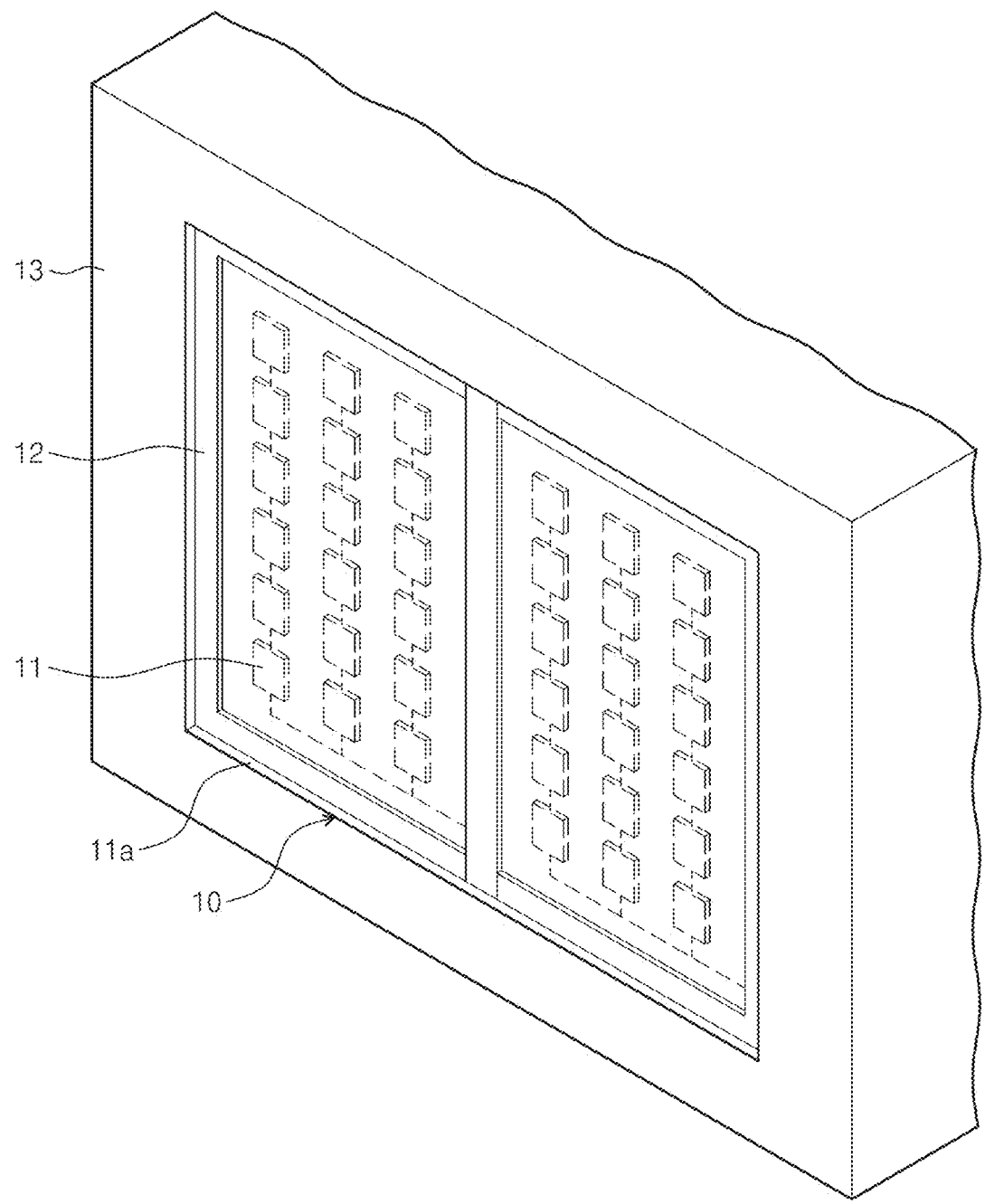
FIG. 1 is a perspective view of a conventional window.
Figure 2:
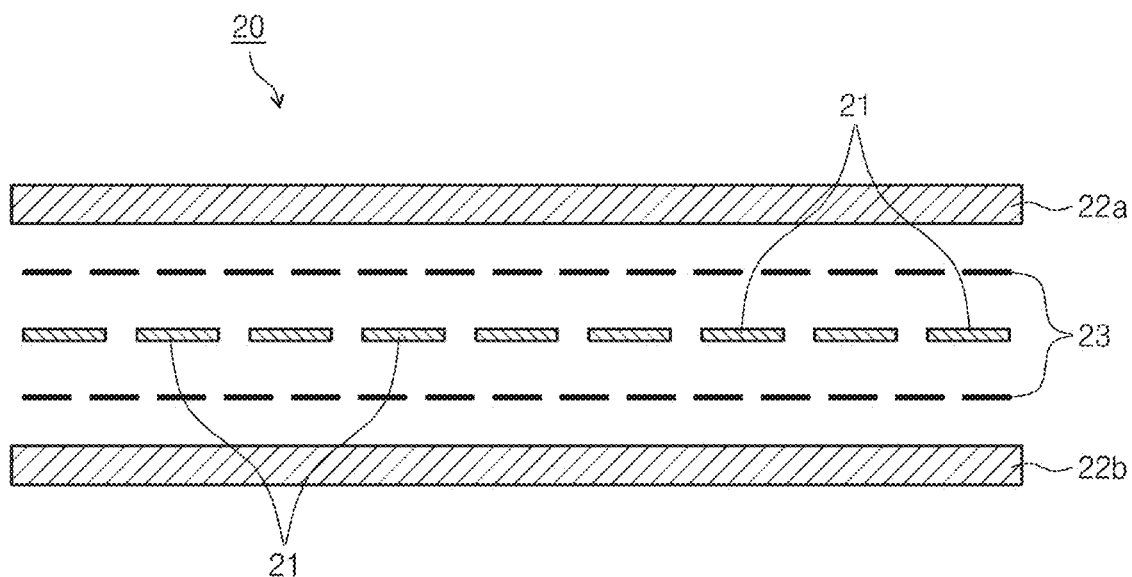
FIG. 2 is a cross-sectional view illustrating a conventional solar cell module.
Figure 3A:
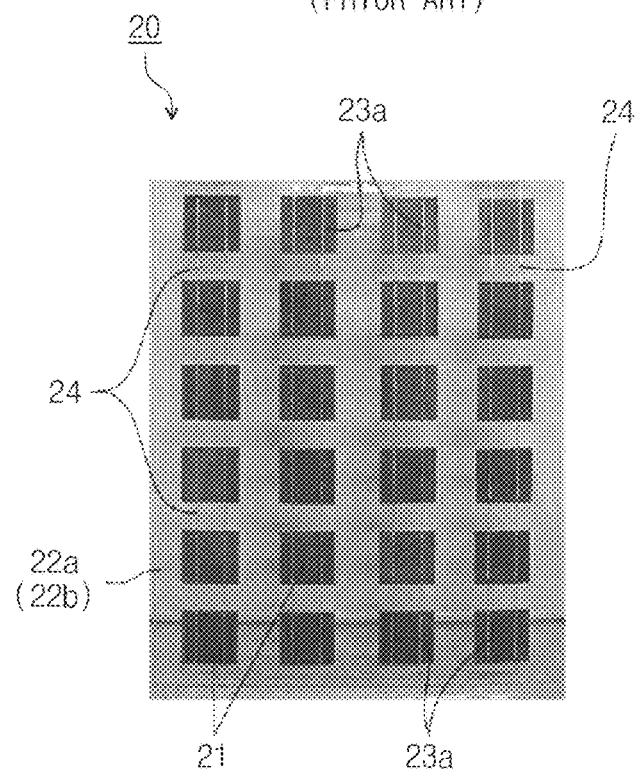
FIG. 3A is a front view illustrating a conventional solar cell module.
Figure 3B:
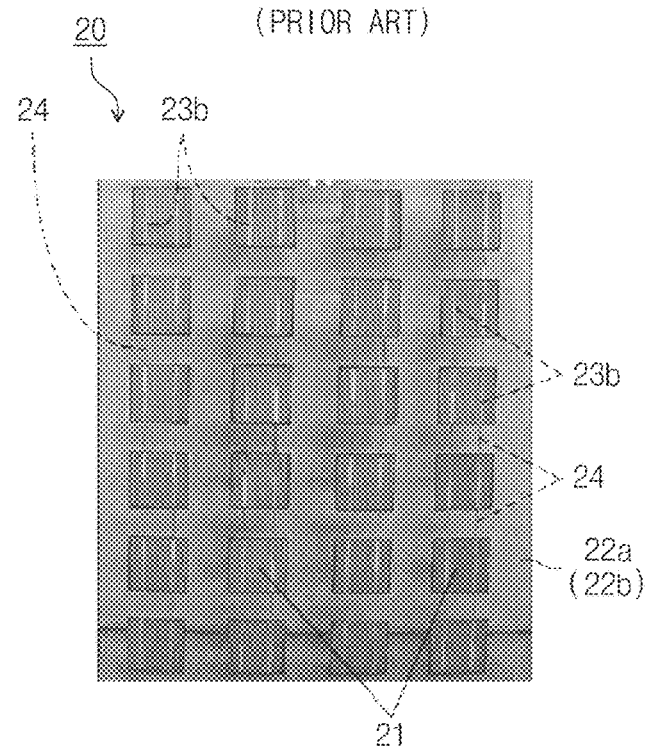
FIG. 3B is a rear view illustrating a conventional solar cell module.

Hereinafter, embodiments of the present disclosure will be described in detail with reference to the accompanying drawings. The embodiments of the present disclosure may be modified in various forms, and the scope of the present disclosure should not be construed to be limited to the following embodiments. The embodiments of the present disclosure are provided to describe the present invention for those skilled in the art more completely. Accordingly, the shapes of the components of the drawings are exaggerated to emphasize clearer description thereof.

The configurations of the present disclosure for clearly describing a solution for the problem that is to be solved by the present disclosure will be described in detail with reference to the accompanying drawings based on a preferred embodiment of the present disclosure, in which the same reference numerals are given for the same elements in denoting the reference numerals for the elements even though they are present in different drawings, and when a drawing has to be referenced for a description of the embodiment, the elements in another drawing also may be cited.

Figure 4:
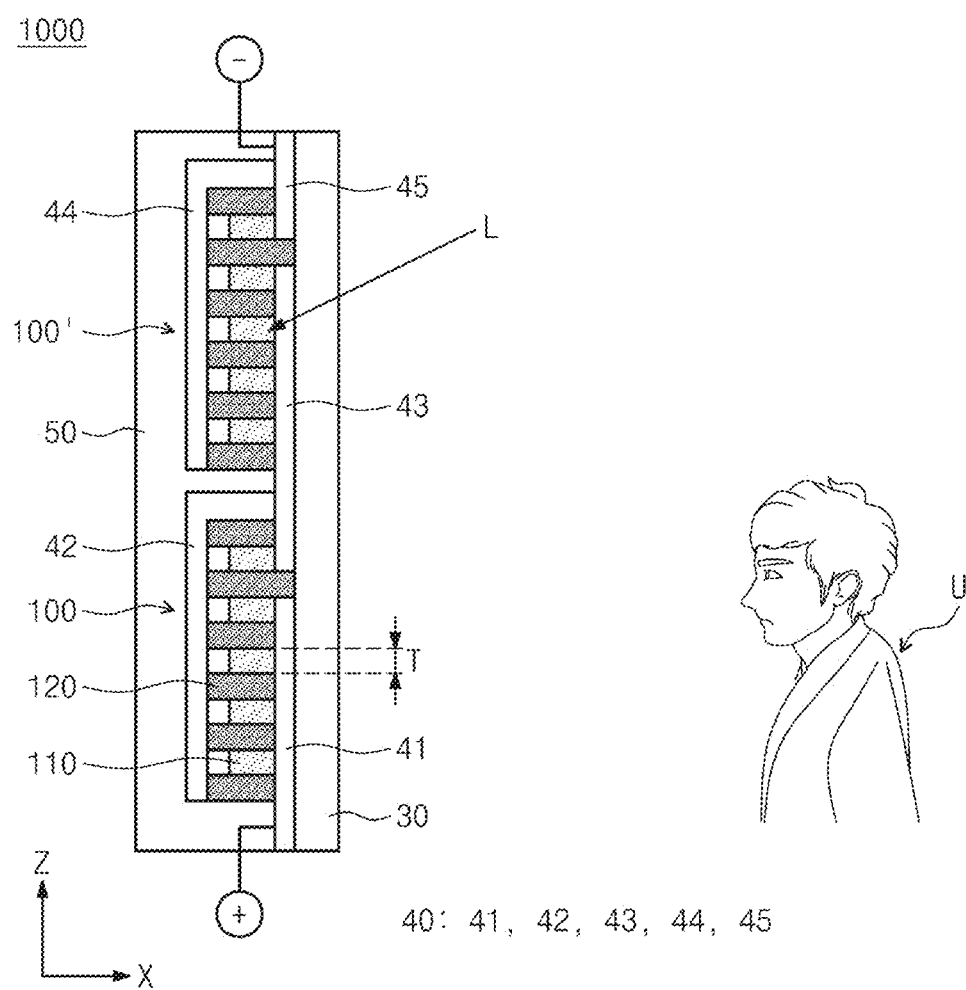
FIGS. 4 and 5 are diagrams illustrating a solar cell module according to an embodiment of the present disclosure.
Figure 5:
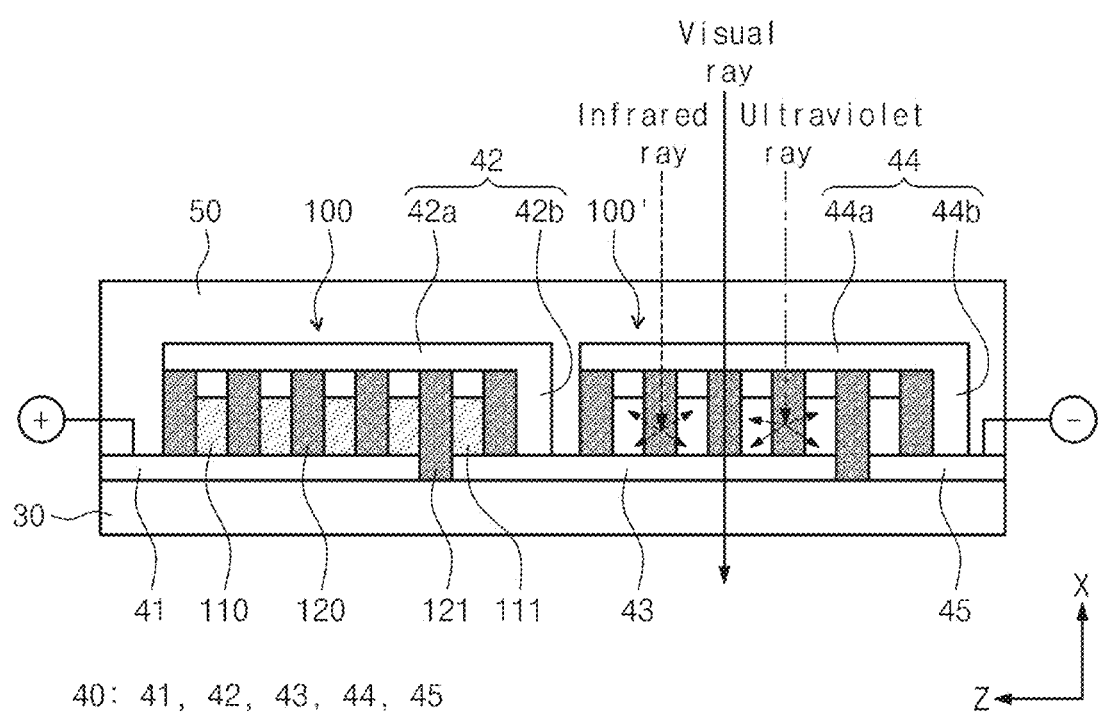

FIGS. 4 and 5 are diagrams illustrating a solar cell module according to an embodiment of the present disclosure.

Referring to FIGS. 4 and 5, a solar cell module 1000 according to an embodiment of the present disclosure may be constituted by connecting a first solar cell unit 100 and a second solar cell unit 100' in series.

Of course, although not illustrated, the solar cell module 1000 according to the embodiment of the present disclosure may be constituted by additionally connecting a third solar cell unit (not illustrated) and a fourth solar cell unit (not illustrated) in series.

That is, in the present disclosure, the number of the solar cell units connected in series is not limited.

Hereinafter, for convenience of description, the solar cell module 1000 according to the embodiment of the present disclosure, in which first solar cell unit 100 and the second solar cell unit 100' are connected to each other in series, will be described.

The solar cell module 1000 according to the embodiment of the present disclosure may include a transparent substrate 30, an electrode layer 40, a molding layer 50, the first solar cell unit 100, and the second solar cell unit 100'.

The transparent substrate 30 may be disposed to face a user "U". The transparent substrate 30 not only may be applied as a window while showing transparent characteristics but also may enhance an efficiency of insulation energy.

Here, the transparent substrate 30 may have a thin film shape that has a length in a height direction (the Z axis direction), and may be formed of a light transmitting material, such as glass.

Here, the transparent substrate 30 may include one surface that faces the user "U" and an opposite surface that is an opposite surface thereto.

The electrode layer 40 may be disposed on the opposite surface of the transparent substrate 30, and may include a first electrode layer 41, a second electrode layer 42, a third electrode layer 43, a fourth electrode layer 44, and a fifth electrode layer 45.

Here, it is preferable that the electrode layer 40 is formed of a transparent electrode, and the electrode layer 40 may be formed of any one of Al, a nano wire, graphene, transparent conductive oxide (TCO)-based transparent electrodes, such as AZO, ZTO, IGZO, ZITO, and SiZO, a hybrid (complex material) transparent electrode, and a CNT-based transparent electrode.

The first electrode layer 41 may be directly connected to a first terminal (+).

The second electrode layer 42 may be electrically connected to the first electrode layer 41 through the first solar cell unit 100, and may be directly connected to the third electrode layer 43.

The third electrode layer 43 may be directly connected to the second electrode layer 42.

The fourth electrode layer 44 may be electrically connected to the third electrode layer 43 through the second solar cell unit 100', and may be directly connected to the fifth electrode layer 45.

The fifth electrode layer 45 may be directly connected to the fourth electrode layer 44, and may be directly connected to a second terminal (−).

That is, the electrode layer 40, the first solar cell unit 100 and the second solar cell unit 100' that is adjacent thereto may be connected in series to each other.

Here, the first electrode layer 41, the third electrode layer 43, and the fifth electrode layer 45 may be directly disposed on the opposite surface of the transparent substrate 30, and may be disposed to be spaced apart from each other.

Meanwhile, the second electrode layer 42 may include a (2-1)-th electrode layer 42a that is disposed on an opposite surface of the first solar cell unit 100, and a (2-2)-th electrode layer 42b that extends from one end of the (2-1)-th electrode layer 42a to one side and contacts the third electrode layer 43.

Here, the (2-2)-th electrode layer 42b may be disposed to cover an upper surface of the first solar cell unit 100 (see FIG. 4).

Furthermore, the fourth electrode layer 44 may include a (4-1)-th electrode layer 44a that is disposed on the opposite surface of the second solar cell unit 100', and a (4-2)-th electrode layer 44b that extends from one end of the (4-1)-th electrode layer 44a to one side and contacts the fifth electrode layer 45.

Here, the (4-2)-th electrode layer 44b may be disposed to cover an upper surface of the second solar cell unit 100' (see FIG. 4).

The molding layer 50 may be disposed on opposite sides of the first solar cell unit 100 and the second solar cell unit 100' to surround the first solar cell unit 100 and the second solar cell unit 100' and protect the first solar cell unit 100 and the second solar cell unit 100' from external factors.

Here, the molding layer 50 is transparent, and may be formed of an insulating material.

The first solar cell unit 100 and the second solar cell unit 100' may be disposed on opposite surface of the transparent substrate 30, and each of them may include a plurality of solar cells 110 and a plurality of condensing layers 120.

The plurality of solar cells 110 and the plurality of condensing layers 120 may be disposed alternately. That is, one condensing layer 120 may be disposed between adjacent solar cells 110, and one solar cell 110 may be disposed between adjacent condensing layers 120.

Meanwhile, the plurality of solar cells 110 may be laminated in the X axis direction, and may be arranged in parallel to the transparent substrate 30. That is, a pair of electrodes may be disposed on one side and an opposite side in the X axis direction, respectively, and the pair of electrodes of the solar cell 110 may be connected to the electrode layer 40.

Meanwhile, the solar cells 110 may be of a double-side light reception type as described above, but in the embodiment of the present disclosure, the solar cells 110 may have light receiving surfaces such that the light receiving surfaces face an upper side and have non-light receiving surfaces such that the non-light receiving surfaces face a lower side.

Of course, opposite surfaces of the thin film solar cells are connected to each other by transparent electrodes, and all of the opposite surfaces thereof may be light receiving surfaces.

That is, the solar cells 110 may be installed on one surface of the transparent substrate 30 in a horizontal arrangement, and may collect the input sunlight "L" through the light receiving surfaces and change the sunlight through a photoelectric conversion.

Here, the solar cells 110 may have a thin film shape with a thickness "T" and a width "W".

For example, thin film solar cell type solar cells 110 having a thickness of 10 nm to 10 um may be applied to the solar cells 110.

In detail, the kinds of the solar cells 110 applied in the present disclosure are not limited, but silicon thin film solar cells and the like may be applied in the present disclosure.

Amorphous solar (a-Si) cells that are representative silicon thin film solar cells are solar cells that are manufactured by depositing amorphous silicon on the transparent substrate 30.

Furthermore, the silicon solar cells are manufactured in a tandem scheme of laminating a multi-crystal silicon film on an amorphous silicon thin film or in a multi-junction structure, such as a triple junction, in which a silicon film is further laid on the tandem structure, or manufactured in a hybrid structure to increase conversion efficiency to a level of crystal silicon solar cells.

Although not illustrated, the solar cell of the detailed example includes a semiconductor substrate, an emitter part located on a light receiving surface of the semiconductor substrate, for example, a surface thereof, to which light is input, a front electrode located on the emitter part, a collector for the front electrode, which is located on the emitter part and crosses the front electrode, a passivation located on the emitter part, in which neither the front electrode nor the collector for the front electrode is located, and a rear electrode located on an opposite side to the light receiving surface, that is, on a rear surface of the semiconductor substrate.

The solar cell 110 further includes a back surface field (BSF) part formed between the rear electrode and the semiconductor substrate. The back electric field part is an area, in which impurities of the same conductive type as that of the semiconductor substrate are doped at a higher concentration than that of the semiconductor substrate, that is, a p+ area, and is located inside the rear surface of the semiconductor substrate.

The back electric field part is applied as an electric potential barrier. Accordingly, an efficiency of the solar cells 110 is enhanced as extinction of electrons and holes due to re-bonding thereof on a rear surface part of the semiconductor substrate decreases.

Meanwhile, the thin film type solar cell using silicon may be manufactured by sequentially forming a glass substrate, a lower transparent conductive layer (TCO), a silicon solar cell layer (an a-Si:H p/i/n layer), a first transparent conductive layer (an upper transparent conductive layer), and a rear electrode layer.

A method for manufacturing the silicon thin film type solar cell will be schematically described as follows.

After the lower transparent conductive layer is deposited on the glass substrate, the lower transparent conductive layer is patterned by using a laser scribing process.

Thereafter, an amorphous silicon (a-Si:H) p layer, an i layer, and an n layer are sequentially deposited.

Thereafter, the cells are patterned by using the laser scribing process.

Thereafter, after the first transparent conductive layer (the upper transparent conductive layer) is deposited, the electrode layer is deposited.

Finally, for electric insulation, the rear electrode layer, the first transparent conductive layer (the upper transparent conductive layer), and the solar cell layer are patterned by using a laser scribing process.

Meanwhile, the plurality of solar cells 110 of the first solar cell unit 100 may be connected in parallel to each other through the first electrode layer 41 and the second electrode layer 42. Furthermore, the plurality of solar cells 110 of the second solar cell unit 100' may be connected in parallel to each other through the third electrode layer 43 and the fourth electrode layer 44.

Meanwhile, the first solar cell unit 100 may be connected in series to the second solar cell unit 100' through the second electrode layer 42 and the third electrode layer 43.

As described above, the plurality of solar cells 110 may have a thickness of a nano or micro size, and it is preferable that the nano solar cells are connected in parallel to each other because generated currents are low.

Meanwhile, voltages and currents have to be increased so that the solar cells are actually used. That is, a solar cell module that satisfies a desired current value may be manufactured through parallel connection.

Furthermore, when the plurality of nano solar cells are connected in series to each other, the voltages are increased, and it is preferable that they are connected in parallel to each other.

Furthermore, a solar cell module having a desired voltage value may be finished by manufacturing solar cell units, the solar cells of which are connected in parallel to each other and which have a desired current value, and mutually connecting the units in series.

That is, a solar cell module having a desired voltage value may be finished by manufacturing solar cell units, the small solar cells of which are connected in parallel to each other and which have a desired current value, and connecting the solar cell units in series.

In the present disclosure, the thin film solar cells 110 are installed in a horizontal arrangement that is perpendicular to a height direction of the transparent substrate 30, and are installed in a range, in which they are neither hindered by interferences of an incident angle of sunlight nor interfered in a range of a field of view of the user "U".

Here, the horizontal arrangement means that they are disposed to have a width, in which they are laminated in a widthwise direction (the X axis direction) that is perpendicular to the one surface of the transparent substrate 30 in an upright state in the height direction (the Z axis direction).

Meanwhile, the perpendicular relationship in the embodiment of the present disclosure may mean that an angle therebetween is an angle (for example, 80° to 100°) that is adjacent to a right angle.

However, a range of the angle that defines the perpendicular relationship is not limited in the present disclosure.

Meanwhile, among the plurality of solar cells 110 of the first solar cell unit 100, the solar cell 111 that is adjacent to the (2-2)-th electrode layer 42b may be a dummy solar cell, in which a photoelectric efficiency is not present.

Here, because the polarities of the dummy solar cells connected to the pair of electrodes are the same, it is preferable that the dummy solar cell, in which a photoelectric efficiency is not present, is provided.

Meanwhile, a structure of the present disclosure is very fine, and thus at least one dummy solar cell may be made in a manufacturing process.

The condensing layer 120 may include condensing particles disposed in a form of a plurality of nano particles in a transparent resin layer, and may disperse the input sunlight "L" and condense the light toward the solar cells 110, and through this, may enhance the photoelectric efficiency.

Here, the condensing layer 120 may transmit light of a visual ray band and disperse light of infrared ray and ultraviolet ray bands, and thus may enhance visibility, and the solar cells may receive light of infrared ray and ultraviolet ray band, whereby electric power generated by the solar cells may be increased.

Luminescent solar concentrators (LSCs) may be applied as the condensing layers 120.

The plurality of condensing layers 120 of the first solar cell unit 100 may be horizontally arranged in the X axis direction on the first electrode layer 41 and the third electrode layer 43. Furthermore, at least one of the plurality of condensing layers 120 may have a length that is larger than that of an adjacent condensing layer 120, and may be disposed in a spacing space between the first electrode layer 41 and the third electrode layer 43 to directly contact the transparent substrate 30.

That is, the first electrode layer 41 and the third electrode layer 43 may be insulated from each other, through the condensing layer 121.

Furthermore, the plurality of condensing layers 120 of the second solar cell unit 100' may be horizontally arranged in the X axis direction on the third electrode layer 43 and the fifth electrode layer 45. Furthermore, at least one of the plurality of condensing layers 120 may have a length that is larger than that of an adjacent condensing layer 120, and may be disposed in a spacing space between the third electrode layer 43 and the fifth electrode layer 45 to directly contact the transparent substrate 30.

That is, the third electrode layer 43 and the fifth electrode layer 45 may be insulated from each other, through the condensing layer 121.

Hereinafter, characteristics of the solar cell module 1000 having a parallel/series connection structure according to the embodiment of the present disclosure will be described with reference to FIGS. 6 to 9.

Figure 7A:
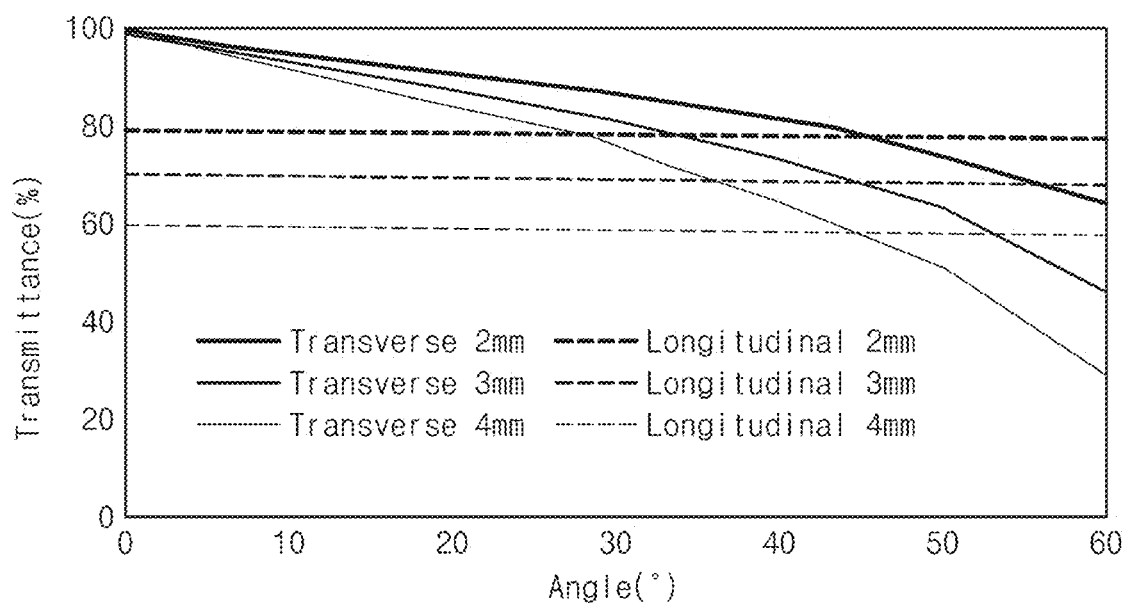
FIG. 7A is a graph depicting transmittances that vary according to solar cell arrangement states of a solar cell module of the present disclosure.
Figure 7B:
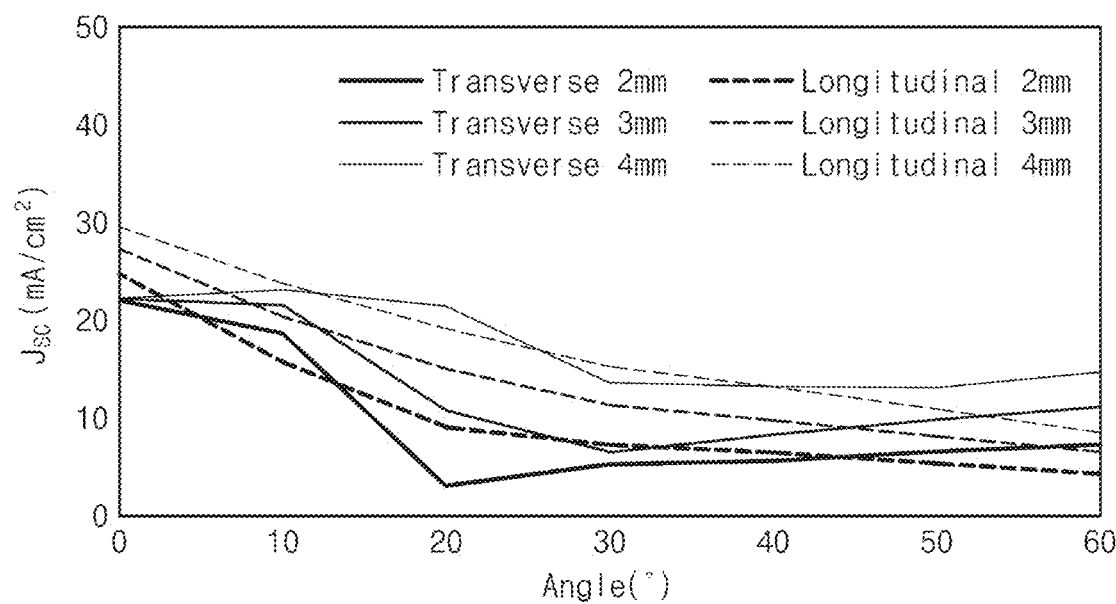
FIG. 7B is a graph depicting condensing rates that vary according to solar cell arrangement states of a solar cell module of the present disclosure.
Figure 8:
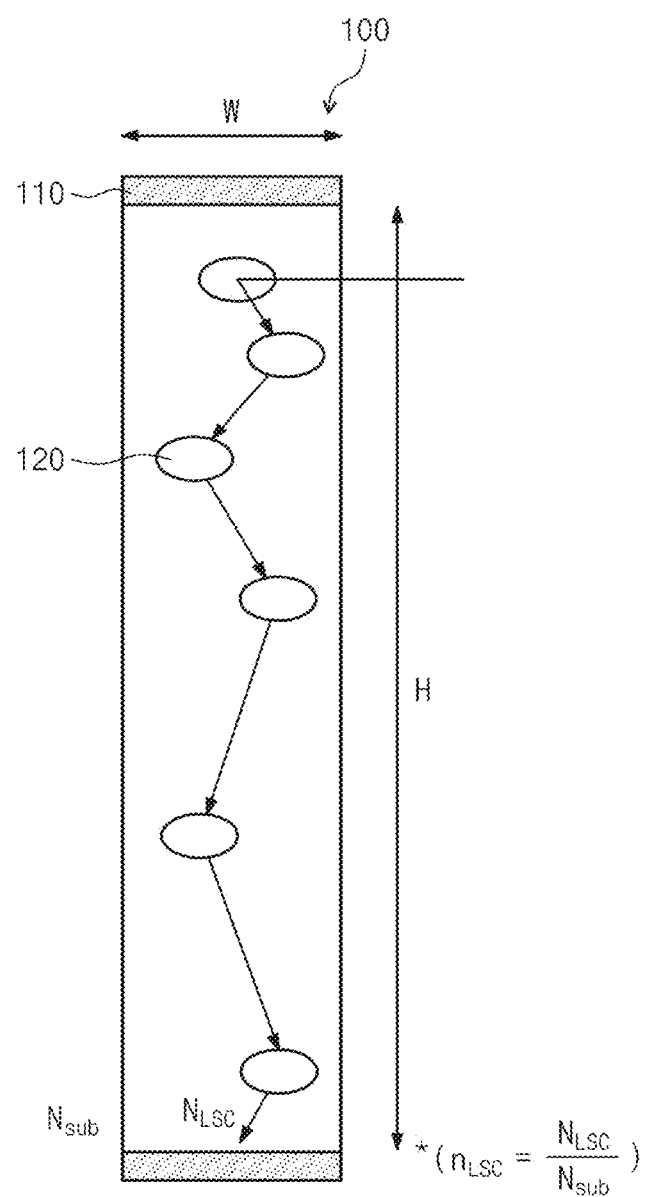
FIG. 8 is a diagram illustrating arrangement states of solar cells and condensing layers of a solar cell module of the present disclosure.
Figure 9:
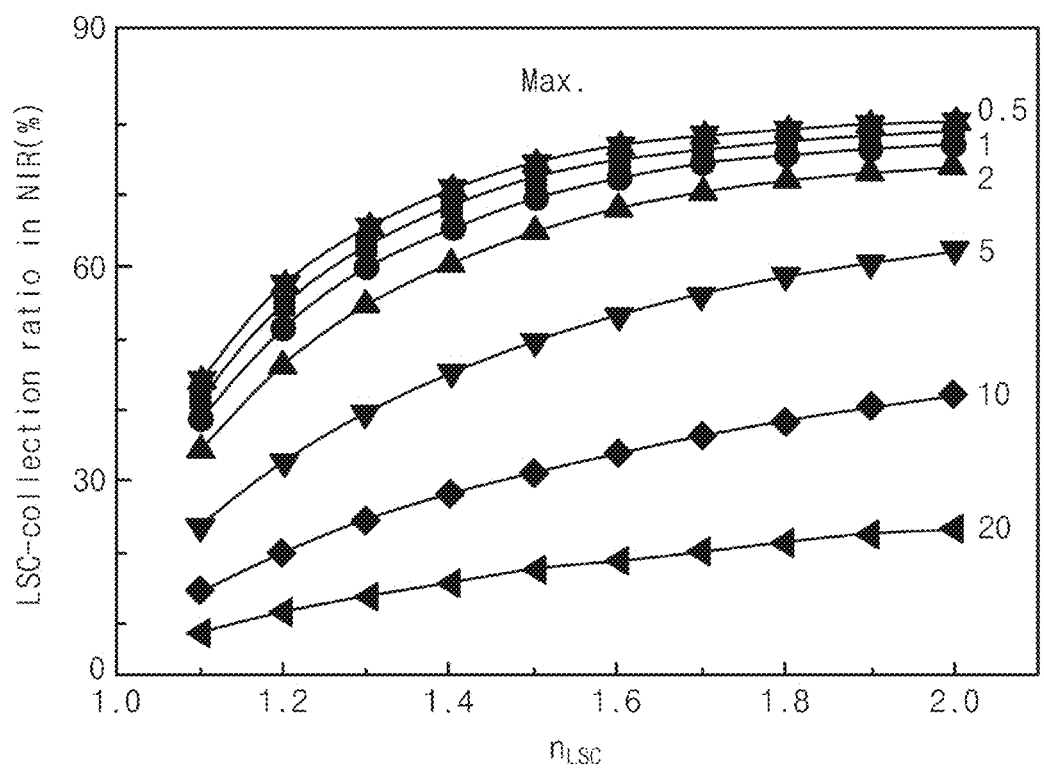
FIG. 9 is a graph depicting light collection rate states according to installation of the solar cells and the condensing layers of the solar cell module of the present disclosure.

FIG. 6A is a diagram illustrating a horizontal arrangement state of solar cells. FIG. 6B is a diagram illustrating a vertical arrangement state of solar cells. FIG. 7A is a graph depicting transmittances that vary according to solar cell arrangement states of the solar cell module of the present disclosure. FIG. 7B is a graph depicting condensing rates that vary according to the solar cell arrangement states of the solar cell module of the present disclosure. FIG. 8 is a diagram illustrating arrangement states of the solar cells and the condensing layers of the solar cell module of the present disclosure. FIG. 9 is a graph depicting light collection rate states according to installation of the solar cells and the condensing layers of the solar cell module of the present disclosure.

Referring to FIGS. 6 and 7, as in Table 1 as follows, it can be seen that condensing rates vary according to the vertical arrangement or the horizontal arrangement of the solar cells 110.

TABLE 1

| | Incident angle of 0 degrees | | | | | |
|---|---|---|---|---|---|---|
| | Transverse 2 mm | Transverse 3 mm | Transverse 4 mm | Longitudinal 2 mm | Longitudinal 3 mm | Longitudinal 4 mm |
| Jsc (mA/cm$^2$) | 26.2 | 26.4 | 26.4 | 28.8 | 31.3 | 33.5 |
| Condensing rates | 3.6 | 2.4 | 1.8 | 4 | 2.9 | 2.3 |

As in Table 1, it may be seen that the condensing rate increases when the longitudinal lengths of the solar cells 110 are much larger than the transverse lengths of the solar cells 110 and thus the condensing rate becomes higher in the horizontal arrangement than in the vertical arrangement.

As a result, it is preferable that the solar cells 110 are installed in the horizontal arrangement scheme in the present disclosure.

Furthermore, as illustrated in FIGS. 8 and 9, it may be seen that light collection rates become lower by 20% due to losses related to scattering of the sunlight, reemission of light, and reabsorption of light as the gaps between the solar cells 110 become larger (as the size of the hollow part becomes larger).

Consequently, the plurality of condensing layers 120 may be installed between the solar cells 110 to enhance the light collection rate.

Hereinafter, a method for manufacturing the solar cell module of the present disclosure will be described with reference to FIGS. 10 to 13.

FIGS. 10 to 13 are cross-sectional views sequentially illustrating a method for manufacturing a solar cell module of the present disclosure.

Figure 10:
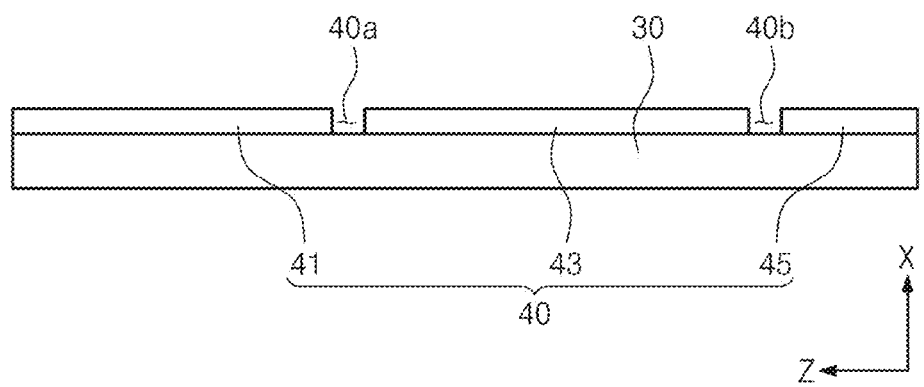
FIGS. 10 to 13 are cross-sectional views sequentially illustrating a method for manufacturing a solar cell module of the present disclosure.

First, referring to FIG. 10, the transparent substrate 30 having a lengthwise direction in the Z axis direction may be disposed, the electrode layer 40 may be disposed on opposite surface of the transparent substrate 30, and may be patterned to be separated into the first electrode layer 41, the third electrode layer 43, and the fifth electrode layer 45.

That is, the first electrode layer 41, the third electrode layer 43, and the fifth electrode layer 45 may be patterned to have spacing spaces 40*a* and 40*b* that are spaced apart from each other.

Figure 11:
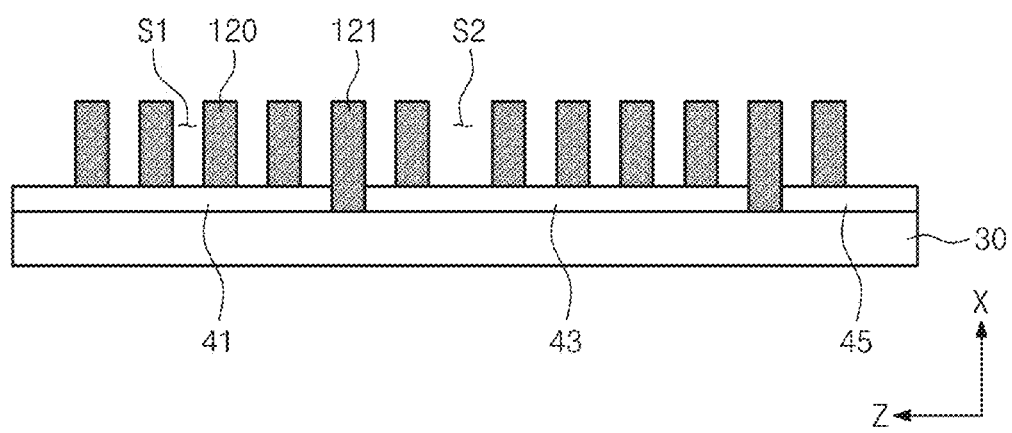

Thereafter, referring to FIG. 11, the condensing layer 120 is disposed on an opposite side of the transparent substrate 30 and may be patterned to be separated into the plurality of condensing layer 120 having spaced spaces S1 and S2.

Here, the condensing layers 121 disposed in the spacing spaces 40*a* and 40*b* of the electrode layer 40 may have a length that is long in the X axis direction as compared with the adjacent condensing layers 120.

That is, the condensing layers 121 disposed in the spacing spaces 40*a* and 40*b* of the electrode layer 40 may directly contact the opposite surface of the transparent substrate 30.

Figure 12:
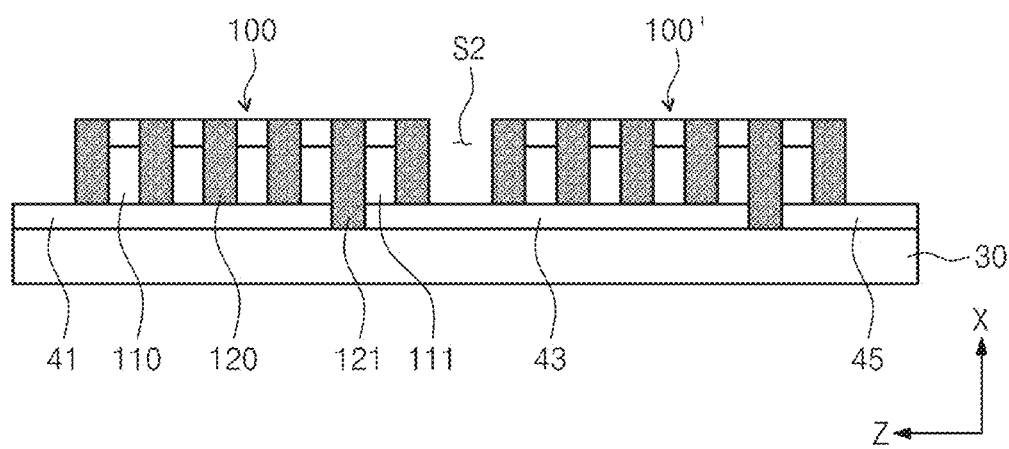

Thereafter, referring to FIG. 12, the plurality of solar cells 110 are formed by laminating the rear electrode, the back electric field part, the semiconductor substrate, the emitter part, the passivation, and the front electrode in each of the spacing spaces S1 of the condensing layers 120.

Through this, the first solar cell unit 100 and the second solar cell unit 100' may be formed.

Here, the first solar cell unit 100 and the second solar cell unit 100' may be spaced apart from each other through the spacing space S2 of the condensing layer 120.

Figure 13:
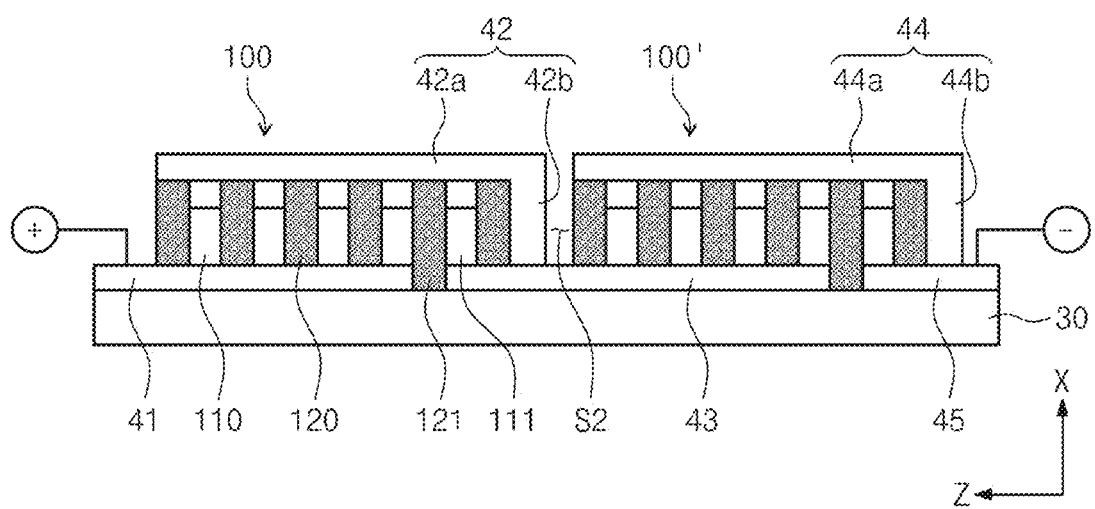

Thereafter, referring to FIG. 13, the (2-1)-th electrode layer 42*a* may be disposed on the opposite surface of the first solar cell unit 100, and the (2-2)-th electrode layer 42*b* extending from the (2-1)-th electrode layer 42*a* may be disposed at an end of the first solar cell unit 100 in a height direction (the Z axis direction), whereby the second electrode layer 42 and the third electrode layer 43 are electrically connected to each other.

Furthermore, the (4-1)-th electrode layer 44*a* may be disposed on the opposite surface of the second solar cell unit 100', and the (4-2)-th electrode layer 44*b* extending from the (4-1)-th electrode layer 44*a* may be disposed at an end of the second solar cell unit 100' in a height direction (the Z axis direction), whereby the fourth electrode layer 44 and the fifth electrode layer 45 are electrically connected to each other.

Furthermore, the first solar cell unit 100 and the second solar cell unit 100' are connected in series to each other by connecting the first terminal (+) to the first electrode layer 41 and connecting the second terminal (−) to the fifth electrode layer 45.

The above detailed description exemplifies the present disclosure. Furthermore, the above-mentioned contents describe the exemplary embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

The invention claimed is:

1. A solar cell module comprising:
    a first solar cell unit including a first plurality of solar cells and a first plurality of condensing layers, which are arranged alternately;
    a second solar cell unit including a second plurality of solar cells and a second plurality of condensing layers, which are arranged alternately;
    a first electrode layer electrically connecting a first terminal and a first surface of the first solar cell unit;
    a second electrode layer electrically connected to a second surface, opposite to the first surface, of the first solar cell unit;
    a third electrode layer electrically connecting the second electrode layer and a first surface of the second solar cell unit;
    a fourth electrode layer electrically connected to a second surface, opposite to the first surface, of the second solar cell unit; and
    a fifth electrode layer electrically connecting the fourth electrode layer and a second terminal,
    wherein the first plurality of solar cells of the first solar cell unit are connected in parallel to each other through the first electrode layer and the second electrode layer,
    wherein the second solar cells of the second solar cell unit are connected in parallel to each other through the third electrode layer and the fourth electrode layer,
    wherein the first solar cell unit and the second solar cell unit are connected in series to each other through the second electrode layer and the third electrode layer,
    wherein the second electrode layer includes:
    a horizontal electrode layer disposed in parallel with the second surface of the first solar cell unit; and
    a vertical electrode layer disposed perpendicular to the second surface of the first solar cell unit and extending from the second surface of the first solar cell unit to the third electrode layer.

2. The solar cell module of claim 1, wherein the first electrode layer, the third electrode layer, and the fifth electrode layer are disposed on a same plane.

3. The solar cell module of claim 2, wherein the first electrode layer, the third electrode layer, and the fifth electrode layer are spaced apart from each other, on the same plane,
    wherein at least one of the condensing layers of the first solar cell unit is disposed in a spacing space between the first electrode layer and the third electrode layer, and
    wherein at least one of the condensing layers of the second solar cell unit is disposed in a spacing space between the third electrode layer and the fifth electrode layer.

4. The solar cell module of claim 1, wherein the fourth electrode layer includes:
    a horizontal electrode layer disposed in parallel with the second surface of the second solar cell unit; and
    a vertical electrode layer disposed perpendicular to the second surface of the second solar cell unit and extending from the second surface of the second solar cell unit to the fifth electrode layer.

5. The solar cell module of claim 4, wherein at least one of the first plurality of solar cells of the first solar cell unit is a dummy solar cell directly connected to the second electrode layer and the third electrode layer, and
    at least one of the second plurality of solar cells of the second solar cell unit is a dummy solar cell directly connected to the fourth electrode layer and the fifth electrode layer.

6. The solar cell module of claim 2, further comprising:
    a transparent substrate disposed on the first surface of the first solar cell unit and the first surface of the second solar cell unit.

7. The solar cell module of claim 6, wherein each of the first plurality of solar cells of the first solar cell unit and the second plurality of solar cells of the second solar cell unit is disposed to be perpendicular to the transparent substrate.

8. The solar cell module of claim 1, wherein the first plurality of condensing layers or the second plurality of condensing layers include a luminescent solar concentrator (LSC).

9. A solar cell module comprising:
    a first solar cell unit including a first plurality of solar cells and a first plurality of condensing layers, which are arranged alternately;
    a second solar cell unit including a second plurality of solar cells and a second plurality of condensing layers, which are arranged alternately;
    a first electrode layer electrically connecting a first terminal and a first surface of the first solar cell unit;
    a second electrode layer electrically connected to a second surface, opposite to the first surface, of the first solar cell unit;
    a third electrode layer electrically connecting the second electrode layer and a first surface of the second solar cell unit;
    a fourth electrode layer electrically connected to a second surface, opposite to the first surface, of the second solar cell unit; and
    a fifth electrode layer electrically connecting the fourth electrode layer and a second terminal,
    wherein the first plurality of solar cells of the first solar cell unit are connected in parallel to each other through the first electrode layer and the second electrode layer,
    wherein the second solar cells of the second solar cell unit are connected in parallel to each other through the third electrode layer and the fourth electrode layer,
    wherein the first solar cell unit and the second solar cell unit are connected in series to each other through the second electrode layer and the third electrode layer,
    wherein the fourth electrode layer includes:

a horizontal electrode layer disposed in parallel with the second surface of the second solar cell unit; and a vertical electrode layer disposed perpendicular to the second surface of the second solar cell unit and extending from the second surface of the second solar cell unit to the fifth electrode layer.

10. The solar cell module of claim 9, wherein the first electrode layer, the third electrode layer, and the fifth electrode layer are disposed on a same plane.

11. The solar cell module of claim 10, wherein the first electrode layer, the third electrode layer, and the fifth electrode layer are spaced apart from each other, on the same plane, wherein at least one of the condensing layers of the first solar cell unit is disposed in a spacing space between the first electrode layer and the third electrode layer, and wherein at least one of the condensing layers of the second solar cell unit is disposed in a spacing space between the third electrode layer and the fifth electrode layer.

12. The solar cell module of claim 9, wherein the second electrode layer includes:

a horizontal electrode layer disposed in parallel with the second surface of the first solar cell unit; and a vertical electrode layer disposed perpendicular to the second surface of the first solar cell unit and extending from the second surface of the first solar cell unit to the third electrode layer.

13. The solar cell module of claim 12, wherein at least one of the first plurality of solar cells of the first solar cell unit is a dummy solar cell directly connected to the second electrode layer and the third electrode layer, and at least one of the second plurality of solar cells of the second solar cell unit is a dummy solar cell directly connected to the fourth electrode layer and the fifth electrode layer.

14. The solar cell module of claim 10, further comprising:

a transparent substrate disposed on the first surface of the first solar cell unit and the first surface of the second solar cell unit.

15. The solar cell module of claim 14, wherein each of the first plurality of solar cells of the first solar cell unit and the second plurality of solar cells of the second solar cell unit is disposed to be perpendicular to the transparent substrate.

16. The solar cell module of claim 9, wherein the first plurality of condensing layers or the second plurality of condensing layers include a luminescent solar concentrator (LSC).

* * * * *